Figure 1:
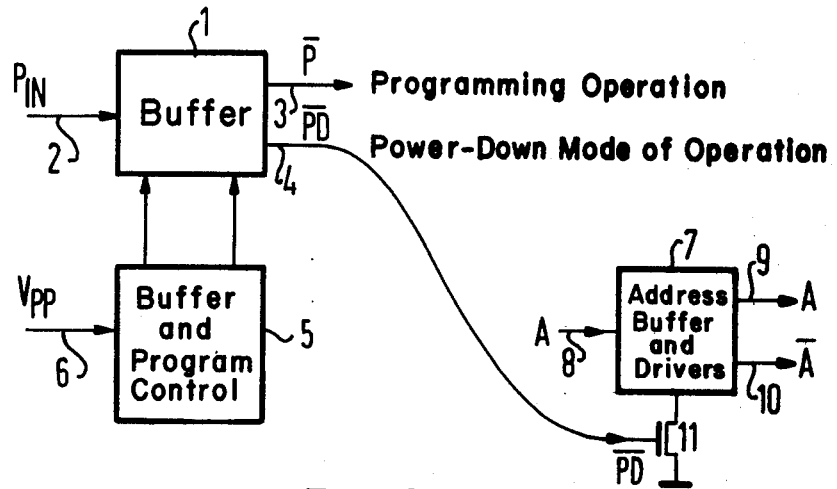

United States Patent [19]

Giebel et al.

[11] Patent Number: 4,458,338
[45] Date of Patent: Jul. 3, 1984

[54] CIRCUIT FOR CHECKING MEMORY CELLS OF PROGRAMMABLE MOS-INTEGRATED SEMICONDUCTOR MEMORIES

[75] Inventors: Burkhard Giebel, Munich; Hans Moormann, Haar; Lothar Schrader, Munich, all of Fed. Rep. of Germany

[73] Assignee: Siemens Aktiengesellschaft, Berlin and Munich, Fed. Rep. of Germany

[21] Appl. No.: 290,514

[22] Filed: Aug. 6, 1981

[30] Foreign Application Priority Data

Aug. 14, 1980 [DE] Fed. Rep. of Germany ....... 3030852

[51] Int. Cl.³ .................... G11C 29/00; G11C 7/00
[52] U.S. Cl. ................................ 365/201; 365/227
[58] Field of Search ............... 365/200, 201, 226, 227

[56] References Cited

U.S. PATENT DOCUMENTS 4,094,012 6/1978 Perlegos et al. .................. 365/226
4,342,103 7/1982 Higuchi et al. .................... 365/201

FOREIGN PATENT DOCUMENTS 56-22278 3/1981 Japan .................................. 365/201

OTHER PUBLICATIONS

Theus et al., "A Self-Testing ROM Device", 1981, IEEE International Solid-State Circuits Conf., 2/19/81, pp. 176, 177, 270, S16910060.

Primary Examiner—Stuart N. Hecker
Attorney, Agent, or Firm—Herbert L. Lerner; Laurence A. Greenberg

[57] ABSTRACT

Circuit arrangement for checking memory cells of programmable MOS-integrated semiconductor memories, especially non-volatile semiconductor memories of the floating-gate type, has an active programming and read mode of operation wherein all word lines of the semiconductor memory with the exception of one selected word line are at a low level. The circuit arrangement also has an inactive power-down mode of operation, wherein all word lines at a high level. Both of the modes of operation are represented by a signal having a first level for the active mode of operation and a second level for the inactive mode of operation. The circuit arrangement further includes a single circuit in the semiconductor memory switchable via a first signal indicating the operating mode for the memory cell test, wherein all of the word lines are addressed by a voltage corresponding to the programming voltage, as a function of a single second signal fed into the semiconductor memory from the outside, from the level indicating the active mode of operation to the level indicating the inactive mode of operation, so that all the word lines can be switched simultaneously to the level required for programming.

5 Claims, 3 Drawing Figures

CIRCUIT FOR CHECKING MEMORY CELLS OF PROGRAMMABLE MOS-INTEGRATED SEMICONDUCTOR MEMORIES

The invention relates to a circuit arrangement for checking memory cells of programmable MOS-integrated semiconductor memories, especially non-volatile semiconductor memories of the floating-gate type, and, more particularly, to such a circuit arrangement having an active programming and read operation mode, wherein all word lines of the semiconductor memory are at a low level with the exception of one selected word line, and having an inactive power-down operating mode, wherein all of the word lines are at a high level, both of these two modes of operation being represented by a signal which has a first level for the active operating mode and a second level for the inactive operating mode.

Semiconductor memories of the type mentioned hereinbefore have become known, for example, from U.S. Pat. No. 4,094,012. For general explanation of the two modes of operation of such a memory, namely, the active programming and read mode of operation as well as the inactive power-down mode of operation, reference is made to the schematic block diagram according to FIG. 1 of the instant application.

For the inactive power-down mode of operation, a signal $P_{IN}$ is introduced via an input line 2 into a buffer 1 which then furnishes, on an output line 4, a signal $\overline{PD}$ for activating the power-down mode of operation.

The memory further contains several address buffers and drivers, into which addresses can be fed via external terminals of the memory and which generate complementary control signals for word line decoders of the memory. For the sake of simplicity, these address buffers and drivers are shown in FIG. 1 in the form of a single block 7, where the addresses generally designated with A are fed-in via an input line 8 and the mentioned complementary control signals for the word line decoders are delivered as signals A and $\overline{A}$ via output lines 9 and 10. These address buffers and drivers are coupled to ground via MOS switching transistors which are shown schematically in FIG. 1 by an MOS switching transistor 11. These switching transistors are addressed by the signal $\overline{PD}$, whereby the address buffers and drivers 7 can be switched inoperative in the power-down operating mode.

For programming operation, a programming potential $V_{PP}$ is fed into a buffer and program control 5 via an input line 6, where this buffer and program control 5 addresses the buffer 1 in such a manner that it delivers (with the input signal $P_{IN}$ then missing) a signal $\overline{P}$ characterizing the active programming and read mode of operation at an output line 3. The signal $\overline{PD}$ characterizing the power-down mode of operation of the output line 4 then assumes a level at which the switching transistors 11 render the address buffer and the driver 7 operative.

Memories of the kind under discussion are then so constructed that, in the inactive power-down mode of operation, all of the word lines are at a high level and in the active programming and read mode of operation, all of the word lines are at a low level with the exception of one selected word line.

In semiconductor memories with memory cells of the floating-gate type, leakage currents can occur due to oxide defects, for example, between the control gate and the floating gate, between the source and the floating gate or the drain and the floating gate. These leakage currents can lead to unintended or undesired reprogramming of the memory cells. For this reason, the memory cells of the semiconductor memory must be subjected to a test wherein a high voltage in the order of magnitude of the programming voltage is applied either to the bit lines or to the word lines. Such a test can be carried out both with the memory cleared as well as programmed, there being checked, in a read operation following the test, whether or not reprogramming has taken place in the memory cells due to the aforementioned leakage current mechanism.

As explained hereinabove, due to the construction of the memory, only one word line can be subjected to the high potential required for the active mode of operation at any one time ever in the active programming and read mode of operation. From this it follows that the resulting test time is thereby equal to the product of the necessary testing time per word line and the total number of the word lines in the memory matrix. For example, for a 16 K-bit memory, with a testing time of 6.4 seconds per word line, a total testing time of more than 13 minutes is obtained.

It is accordingly an object of the invention to provide a circuit arrangement for checking memory cells of programmable MOS integrated semiconductor memories by which the testing time is reduced over that for conventional circuit arrangements of this general type.

With the foregoing and other objects in view, there is provided, in accordance with the invention, a circuit arrangement for checking memory cells of programmable MOS-integrated semiconductor memories, especially non-volatile semiconductor memories of the floating-gate type, having an active programming and read mode of operation, wherein all word lines of the semiconductor memory with the exception of one selected word line are at a low level, and having an inactive power-down mode of operation, wherein all word lines are at a high level, both of the modes of operation being represented by a signal having a first level for the active mode of operation and a second level for the inactive mode of operation, which includes a circuit in the semiconductor memory and switchable via a first signal indicating the operating mode for the memory cell test, wherein the word lines are addressed by a voltage corresponding to the programming voltage, from the level indicating the active mode of operation to the level indicating the inactive mode of operation, as a function of a second signal fed into the semiconductor memory from the outside, so that all the word lines can be switched simultaneously to the level required for programming.

In accordance with another feature of the invention, there is provided a semiconductor memory having an external address terminal for feeding in the second signal to the semiconductor memory from the outside.

In accordance with a further feature of the invention, there is provided a circuit having a voltage discriminator and an MOS switching transistor addressed by the voltage discriminator, a line, via which the first signal indicating the operating mode is supplied, being shortable to ground through the MOS switching transistor.

In accordance with an additional feature of the invention, there is provided a voltage discriminator comprising an even number of series-connected inverter stages formed of MOS transistors.

In accordance with yet another feature of the invention, there is provided a voltage discriminator being made up of four series-connected inverter stages formed of MOS transistors.

Other features which are considered as characteristic for the invention are set forth in the appended claims.

Although the invention is illustrated and described herein as embodied in circuit for checking memory cells of programmable MOS-integrated semiconductor memories, it is nevertheless not intended to be limited to the details shown, since various modifications and structural changes may be made therein without departing from the spirit of the invention and within the scope and range of equivalents of the claims.

Figure 2:
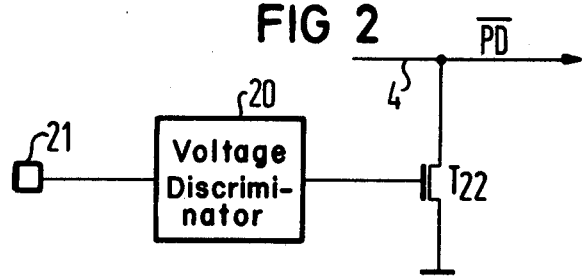
Figure 3:
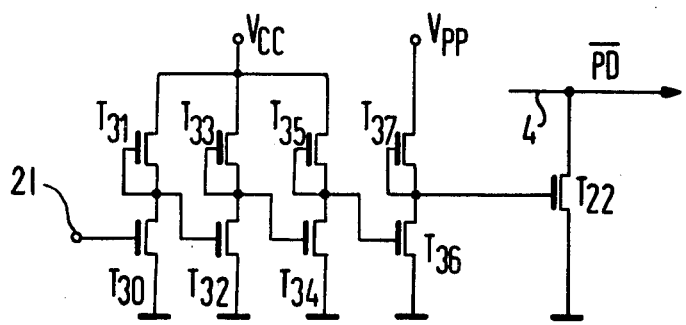

The construction and method of operation of the invention, however, together with additional objects and advantages thereof will be best understood from the following description of specific embodiments when read in connection with the accompanying drawings, in which:

FIG. 1 is a block diagram schematically showing a conventional circuit arrangement for checking memory cells of programmable MOS-integrated semiconductor memories according to the invention; and FIGS. 2 and 3 are respective block and more detailed circuit diagrams of the circuit arrangement according to the invention.

It has been explained hereinbefore in connection with the schematic block diagram according to FIG. 1 that, in programming operation, the programming potential $V_{PP}$ is fed into the buffer and program control 5, and that the buffer 1 then furnishes the signal $\overline{PD}$ via the output line 4, with a level (high level) at which the address buffers and drivers 7 are switched into operation to drive the word line decoder. Normally, only one non-illustrated word line, respectively, of the memory can ever be selected, and thereby switched to a high level, while all of the other word lines are at a low level.

According to FIG. 2, a circuit is provided in the semiconductor memory, via which the signal $\overline{PD}$ can be referred to the level indicating the power-down mode of operation (low level), even though the programming operation is activated. For this purpose, a signal is fed, according to FIG. 2, via an external terminal 21 at the semiconductor memory, to a voltage discriminator 20 which drives an MOS switching transistor $T_{22}$, by means of which the output line 4 of the buffer 1, carrying the signal $\overline{PD}$, is coupled to ground.

The terminal 21 may, especially, be the same as one of the external terminals of the semiconductor memory, by which one of the addresses A is entered into the memory. Provision is made, in this regard, that the corresponding address A and the signal fed into the memory for the testing operation, have different voltage levels which are differentiated by the voltage discriminator 20.

If an address is fed in via the terminal 21, the voltage discriminator 20 delivers no signal whereas, if the signal for the testing operation is fed in, it delivers a signal switching the switching transistor $T_{22}$ into conduction, so that the line 4 is pulled to ground and thereby the signal $\overline{PD}$ is switched to a level indicating power-down operation.

FIG. 3 shows an embodiment of the voltage discriminator 20 according to FIG. 2 with an even number of series-connected inverter stages, four stages in the illustrated embodiment, each of which is formed by a control transistor $T_{30}$, $T_{32}$, $T_{34}$ and $T_{36}$, respectively, as well as an MOS transistor $T_{31}$, $T_{33}$, $T_{35}$ and $T_{37}$, respectively, connected in series therewith as a load. The first three stages are connected to a memory supply voltage $V_{CC}$, while the last stage is at read or programming potential $V_{PP}$.

By suitable selection of the number of inverter stages and the width-to-length ratios (W/L ratio) and the cut-off voltages of the individual transistors such a voltage discriminator can be produced, in accordance with the invention, having an exactly defined threshold below which no output signal is delivered whereas, above this threshold, an output signal is delivered which controls the transistor $T_{22}$ in the manner described hereinbefore in connection with FIG. 2.

There are claimed:

1. Circuit arrangement for checking memory cells of programmable MOS-integrated semiconductor memories, especially non-volatile semiconductor memories of the floating-gate type, having an active programming and read mode of operation, wherein all word lines of the semiconductor memory with the exception of one selected word line are at a low level, and having an inactive power-down mode of operation, wherein all word lines are at a high level, both of the modes of operation being represented by a signal having a first level for the active mode of operation and a second level for the inactive mode of operation, comprising a single circuit in the semiconductor memory switchable via a first signal indicating the operating mode for the memory cell test, wherein all of the word lines are addressed by a voltage corresponding to the programming voltage, as a function of a single, second signal fed into the semiconductor memory from the outside, from the level indicating the active mode of operation to the level indicating the inactive mode of operation, so that all the word lines can be switched simultaneously to the level required for programming.

2. Circuit arrangement according to claim 1, wherein the semiconductor memory has an external address terminal for feeding in said second signal to the semiconductor memory from the outside.

3. Circuit arrangement according to claim 1 wherein said circuit has a voltage discriminator and an MOS switching transistor addressed by said voltage discriminator, a line, via which said first signal indicating the operating mode is supplied, being shortable to ground through said MOS switching transistor.

4. Circuit according to claim 3, wherein said voltage discriminator comprises an even number of series-connected inverter stages formed of MOS transistors.

5. Circuit according to claim 1, 3, wherein said voltage discriminator is made up of four series-connected inverter stages formed of MOS transistors.

* * * * *